US012757432B2

(12) United States Patent
Hsin et al.

(10) Patent No.: US 12,757,432 B2
(45) Date of Patent: Oct. 6, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Bo-Huan Hsin, Hsinchu (TW); Ying-Han Chiou, Hsinchu (TW); Ming-Yen Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 573 days.

(21) Appl. No.: 18/205,191

(22) Filed: Jun. 2, 2023

(65) Prior Publication Data

US 2024/0405126 A1 Dec. 5, 2024

(51) Int. Cl.

| | |
|---|---|
| ***H10D 30/62*** | (2025.01) |
| ***H10D 30/01*** | (2025.01) |
| ***H10D 62/10*** | (2025.01) |
| ***H10D 62/13*** | (2025.01) |
| ***H10D 62/17*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ....... *H10D 30/6211* (2025.01); *H10D 30/024* (2025.01); *H10D 62/102* (2025.01); *H10D 62/151* (2025.01); *H10D 62/292* (2025.01); *H10D 84/0193* (2025.01); *H10D 84/038* (2025.01); *H10D 84/853* (2025.01)

(58) Field of Classification Search

CPC ............. H10D 30/6211; H10D 30/024; H10D 62/102; H10D 62/151; H10D 62/292; H10D 84/0193; H10D 84/038; H10D 84/853; H10D 30/62

See application file for complete search history.

(56) References Cited

U.S. PATENT DOCUMENTS

2020/0343144 A1* 10/2020 Li ........................ H10D 84/834
2023/0197826 A1* 6/2023 Radlinger .......... H10D 84/0151 257/401
2024/0170063 A1* 5/2024 Yu .......................... H10B 10/12

* cited by examiner

*Primary Examiner* — Britt Hanley
*Assistant Examiner* — William C. Trice, III
(74) *Attorney, Agent, or Firm* — Birch, Stewart, Kolasch & Birch, LLP

(57) ABSTRACT

A semiconductor device and a manufacturing method of the semiconductor device are provided. The semiconductor device includes a source region, a drain region, a channel region and a plurality of fins. The channel region is located between the source region and the drain region, and the fins pass through the source region, the drain region and the channel region, wherein a number of the fins located in the source region and the drain region and a number of the fins located in the channel region are not equal.

20 Claims, 10 Drawing Sheets

SEMICONDUCTOR DEVICE AND MANUFACTURING METHOD THEREOF

BACKGROUND

The electronics industry has a growing demand for smaller and faster electronic devices that can simultaneously support a greater number of increasingly complex functions. Accordingly, there is a continuing trend in the semiconductor industry to manufacture low cost, high performance and low power integrated circuits (ICs). So far, these goals have been achieved largely by reducing IC dimensions (e.g., minimum feature size) of a semiconductor to increase production efficiency and reduce associated manufacture costs. However, this technique of reducing the IC dimensions of the semiconductor also increases the complexity of the semiconductor manufacturing process. Therefore, in order to cope with the continuous improvement and IC technologies of semiconductor, the semiconductor manufacturing processes and related technologies also need to be improved.

Recently, multi-gate devices have been introduced into fin field-effect transistors (FinFETs). FinFETs have been used in various applications, for example, to implement logic devices/circuits and to provide static random-access memory (SRAM) devices or the like. Generally speaking, logic devices may focus on performance (e.g., high current switching ratio (Ion/Ioff ratio), low parasitic capacitance, etc.), while SRAM devices may focus on optimizing the size of memory cells and improving operating voltages of memory cells and other requirements. However, optimization of the performance and/or design requirements of FinFET devices has been challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
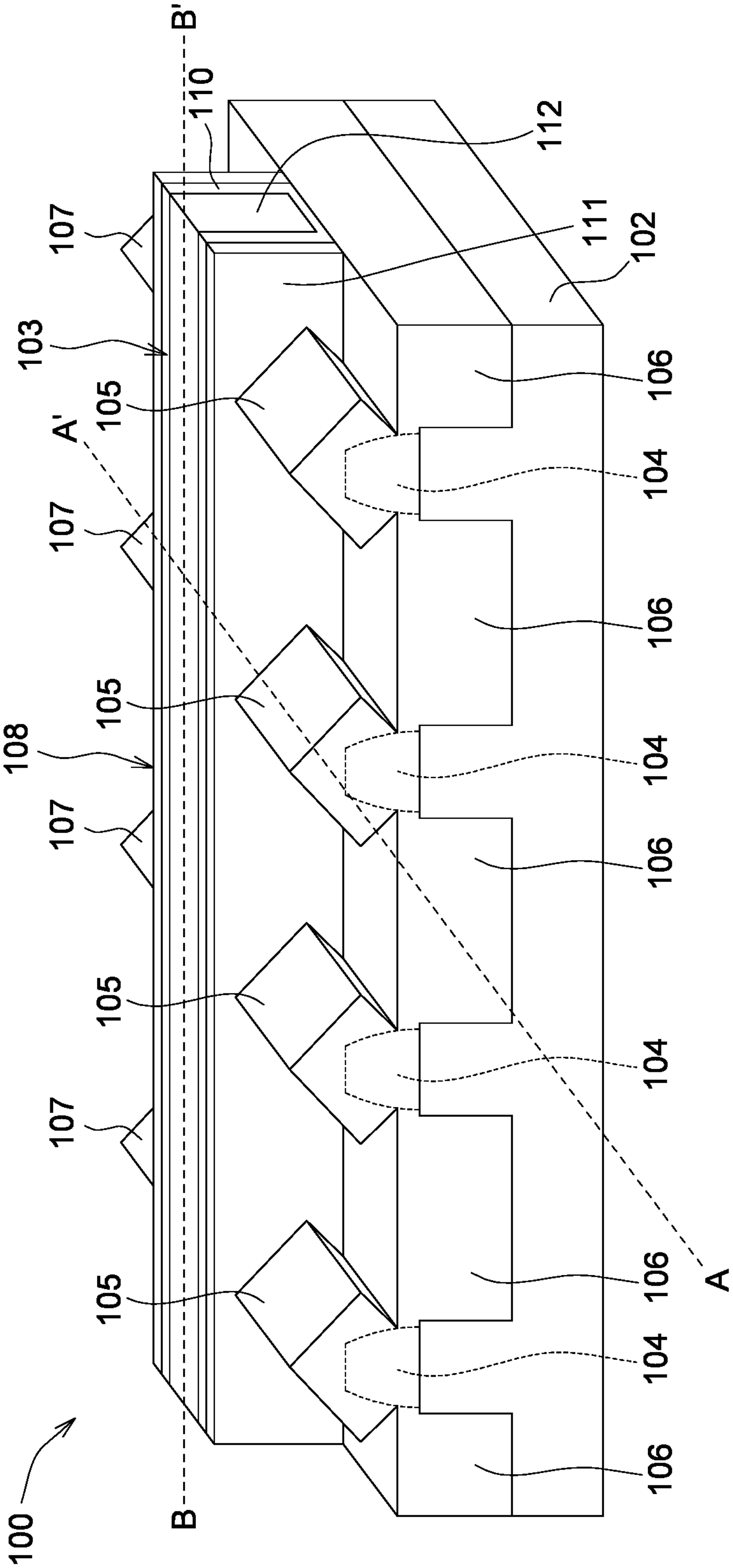
FIG. 1 is a three-dimensional schematic diagram of a FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The semiconductor device of the present disclosure presents embodiments in the form of a multi-gate transistor or a fin multi-gate transistor, referred to herein as a fin field-effect transistor (FinFET) device. Such FinFET devices include P-type metal-oxide-semiconductor FinFET devices or N-type metal-oxide-semiconductor FinFET devices. FinFET devices can be dual-gate devices, tri-gate devices, bulk devices, silicon-on-insulator devices, or other configurations. For example, some embodiments as described herein can also be applied to a gate-all-around device (GAA device), an Omega-gate device (Ω-gate), or a π-type gate device (Pi-gate device).

FinFET devices have become popular candidates for high performance and low leakage applications (e.g., for logic devices and/or circuits). In various examples, FinFET devices employ narrow fin widths for short channel control, improved Ion/Ioff ratio, and continuously variable gate lengths. Additionally, FinFET devices with multiple fins have been used in high-speed applications, but such devices still suffer from increased current leakage and power consumption. In some embodiments, a single fin FinFET device may be used to mitigate current leakage and power consumption issues, but this may also result in a reduction in the speed of the FinFET device. Embodiments of the present disclosure can alleviate the current leakage and power consumption issues of the FinFET device with multiple fins, and also avoid the reduction in the speed of the FinFET device.

Referring to FIG. 1, FIG. 1 is a three-dimensional schematic diagram of a FinFET device. The FinFET device 100 is a fin-based multi-gate field effect transistor. FinFET device 100 includes a substrate 102, at least one fin 104 extending from substrate 102, an isolation region 106, and a gate structure 108 disposed on and around the fin 104. The substrate 102 may be a semiconductor substrate, such as a silicon substrate. The substrate 102 may include an insulating layer formed on the semiconductor substrate. The substrate 102 may include various doping configurations according to design requirements known in the art. The substrate 102 may also include other semiconductors, such as germanium, silicon carbide (SiC), silicon germanium (SiGe) or diamond. Alternatively, the substrate 102 may include compound semiconductors and/or alloy semiconductors. Furthermore, in some embodiments, the substrate 102 may include an epitaxial layer (epi-layer) or SOI (silicon-on-insulator) structure.

The fins 104 may include silicon or other elemental semiconductors, such as germanium. Compound semiconductors include silicon carbide, gallium arsenide, gallium phosphide, indium phosphide, indium arsenide and/or indium antimonide). Alloy semiconductors include SiGe, GaAsP, AlInAs, AlGaAs, InGaAs, GaInP, and/or GaInAsP, or combinations thereof. The fins 104 may be fabricated using suitable processes including photolithography and etch processes. The photolithography process may include forming a photoresist layer covering the substrate 102, exposing the photoresist layer to form a pattern by performing a post-exposure bake process, and a masking element is used to form the pattern included in the photoresist layer. In some embodiments, patterning the photoresist layer to form the fabricated device may be performed using an e-beam lithography process. The photoresist layer may be used to protect areas of the substrate 102, and then recesses are formed in the silicon layer during an etch process for leaving the extended fins 104. The method of etching the recesses includes dry etching, wet etching and/or other suitable methods. The fins 104 on the substrate 102 may also be formed using other embodiments.

Each of the plurality of fins 104 is included in a source region 105 and a drain region 107, wherein the source region 105 and the drain region 107 are formed in, over and/or around the fins 104. The source/drain regions 105 and 107 may be epitaxially grown on the fins 104. The channel region 103 of the transistor is disposed within the fin 104 and below the gate structure 108 along a plane substantially parallel to the plane defined by section A-A' of FIG. 1. In some examples, the channel region 103 of the fins 104 includes a high mobility material, such as germanium, any of the compound semiconductors or alloy semiconductors discussed above, and/or combinations thereof. High mobility materials include those materials that have greater electron mobility than silicon. For example, in some embodiments, the high mobility material may be a silicon-based material having an intrinsic electron mobility of about 1350 $cm^2/V\text{-}s$ and a hole mobility of about 480 $cm^2/V\text{-}s$ above room temperature (300K).

The isolation region 106 may be a shallow trench isolation (STI) feature, or a field oxide, a local oxidation of silicon (LOCOS) feature and/or other suitable isolation features on and/or within the substrate 102. The isolation region 106 can be composed of the following materials: silicon oxide, silicon nitride, silicon oxynitride, fluorine-doped silicate glass (FSG), low-k dielectrics, combinations thereof, and/or other suitable materials known in the art. In one embodiment, the STI feature can be formed into an isolation structure in the substrate 102 by etching trench technology. The trenches may then be filled with isolation material and subjected to a chemical mechanical polishing (CMP) process. In some embodiments, isolation region 106 may include a multi-layer structure, e.g., having one or more liner layers.

The gate structure 108 includes a gate stack, the gate stack includes a gate dielectric layer 110 and a gate electrode layer 112 formed above the gate dielectric layer 110. In some embodiments, the gate dielectric layer 110 may include an interfacial layer formed on the channel region 103 of the fins 104 and a high-K dielectric layer above the interfacial layer. The interface layer of the gate dielectric layer 110 may include a dielectric material, such as a silicon oxide layer ($SiO_2$) or a silicon oxynitride (SiON). The high-K dielectric layer of the gate dielectric layer 110 may include: $HfO_2$, $TiO_2$, HfZrO, $Ta_2O_3$, $HfSiO_4$, $ZrO_2$, $ZrSiO_2$, combinations thereof, or other suitable materials. In other embodiments, the gate dielectric layer 110 may include silicon dioxide or other suitable dielectrics. The gate dielectric layer 110 can be deposited by chemical oxidation, thermal oxidation, atomic layer deposition (ALD), physical vapor deposition (PVD), chemical vapor deposition (CVD) and/or other suitable methods.

The gate electrode layer 112 may include a conductive layer, for example, W, TiN, TaN, WN, Re, Ir, Ru, Mo, Al, Cu, Co, Ni, combinations thereof and/or other suitable compositions. In some embodiments, the gate electrode layer 112 may include a first group of metal materials for N-type FinFET and a second group of metal materials for P-type FinFET. Accordingly, FinFET device 100 may include a dual work-function metal gate configuration. For example, the first metallic material (for an N-type device) may comprise a metal having a work function substantially aligned with that of the substrate conduction band, or at least substantially aligned with a work function of the conduction band of the channel region of the fin 104. Likewise, for example, the second metallic material (for a P-type device) may comprise a metal having a work function substantially aligned with that of the conduction band of the substrate, or at least substantially aligned with a work function of the conduction band of the channel region 103 of the fin 104. Accordingly, the gate electrode layer 112 may provide a gate electrode to the FinFET device 100, including N-type and P-type FinFET devices. In some embodiments, the gate electrode layer 112 may include polysilicon layers alternately stacked. The gate electrode layer 112 may be formed using physical vapor deposition (PVD), chemical vapor deposition (CVD), electron beam evaporation, and/or other suitable processes. In some embodiments, sidewall spacers 111 are formed on sidewalls of the gate structure 108. The sidewall spacers 111 may include dielectric materials such as silicon oxide, silicon nitride, silicon carbide, silicon oxynitride or combinations thereof.

Figure 2:
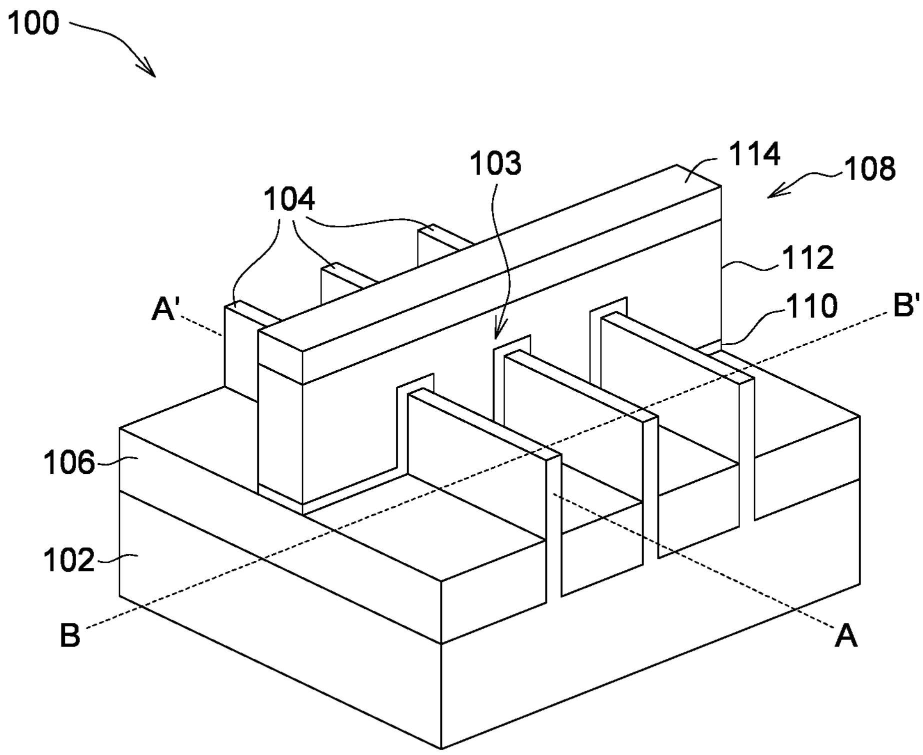
FIG. 2 is an example of a multi-gate FET device along the B-B' section of FIG. 1.

FIG. 2 is an example of a multi-gate FET device 100 along the B-B' section of FIG. 1. The gate structure 108 includes a gate dielectric layer 110, a gate electrode layer 112 and a hard mask layer 114. The hard mask layer 114 may include any material suitable for respectively patterning the gate electrode layer 112 with specific dimensions and/or attributes, including silicon nitride, silicon oxynitride, silicon carbonitride or a combination thereof, etc. The hard mask layer 114 may be deposited by CVD, PVD, ALD, or other deposition techniques. In some embodiments, the gate structure 108 further includes a capping layer and/or other suitable layers. The gate structure 108 engages the fins 104 on two or three sides of the fins 104.

In some embodiments, a photoresist layer is formed on the hard mask layer 114 in a subsequent process. A part of the photoresist layer is removed through photolithography, so that the photoresist layer has an opening corresponding to the at least one fin 104 to be removed. At least one fin 104' in the multi-fin structure and the gate dielectric layer 110, gate electrode layer 112 and hard mask layer 114 covering the fin 104' can be removed by an etching process. Etching processes include plasma etching processes, wet chemical etching processes, and/or other types of etching processes. After one fin of the multi-fin structure is etched, the number of fins is reduced, for example, the original fin number of 2 is reduced to 1.5 or a single fin, and the original fin number of 3 is reduced to 2, 2.5 or 1.5 fin, which can reduce the current leakage and power consumption issues of the conventional FinFET device with multiple fins and can also avoid the reduction of the speed of the conventional FinFET device with single fin.

Figure 3A:
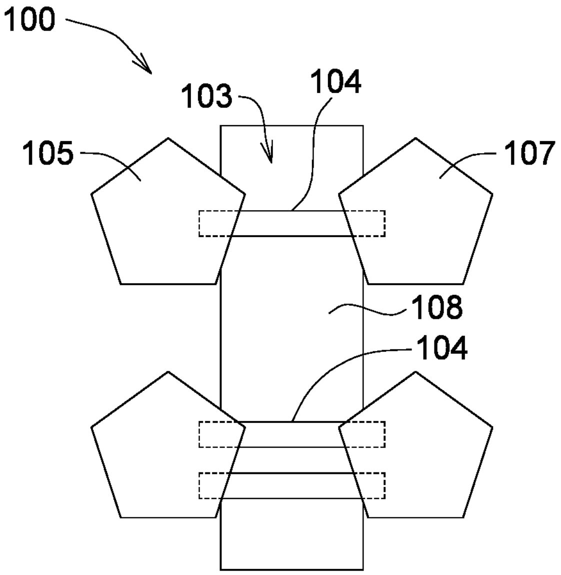
FIGS. 3A and 3B are schematic top views of a FinFET device with normal fin counts.
Figure 3B:
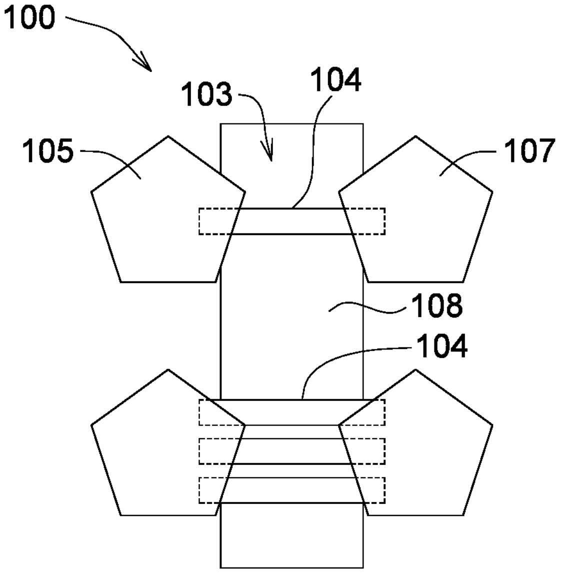

Referring to FIG. 3A and FIG. 3B, which illustrate a schematic top view of a FinFET device 100 with normal fin counts. The source region 105 and the drain region 107 are located on opposite sides of the gate structure 108, and the fin 104 is connected between the source region 105 and the drain region 107 and located under the gate structure 108. The fin structure has a single fin 104, two fins 104, three fins 104 or more, and the number of fins 104 can represent the number of channels of the transistor. In some embodiments, the number of fins 104 in the source region 105 and the drain region 107 is equal to the number of fins 104 in the channel region 103.

Figure 4A:
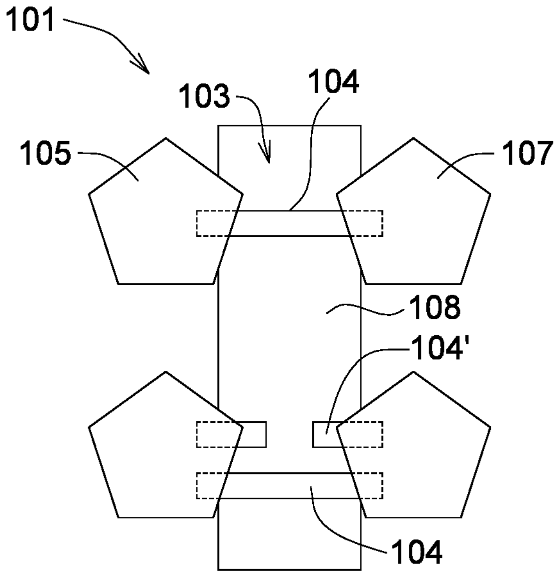
FIGS. 4A and 4B are schematic top views of a FinFET device with reduced fin counts.
Figure 4B:
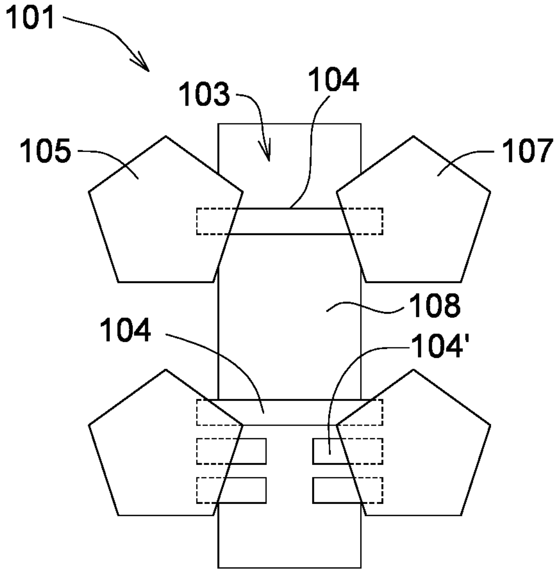

Referring to FIG. 4A and FIG. 4B, which illustrate a schematic top view of a FinFET device 101 with a reduced number of fins. The source region 105 and the drain region 107 are located on opposite sides of the gate structure 108, and the fins 104 and 104' are connected between the source region 105 and the drain region 107 and located under the gate structure 108. The difference from the aforementioned FinFET device 100 is that the number of fins 104 originally in the channel region 103 is reduced after being etched. The number of fins 104 in the source region 105 and the drain region 107 is not equal to the number of fins 104 and 104' in the channel region 103. For example, the original fin number of 2 becomes 1.5 or 1, or the original fin number of 3 becomes 2, 2.5 or 1.5. The non-integer part represents the remaining part of a fin after the fin is etched partially, the length of the etched fin 104' is shortened (for example, the height is reduced by ½ or more) and the number of total fins 104 is reduced, so that the current passing through the channel region 103 will also decrease. In some embodiments, the number of fins 104 in the source region 105 and the drain region 107 is not equal to the number of fins 104 in the channel region 103. The number of remaining fins 104 and 104' can represent the number of channels of the transistor. When the number or height of fins 104 is reduced, the number of channels will also be reduced. Therefore, the FinFET device 101 with reduced number of fins and/or reduced fin height can control the current passing through the channel region 103 to reduce power consumption.

Figure 5A:
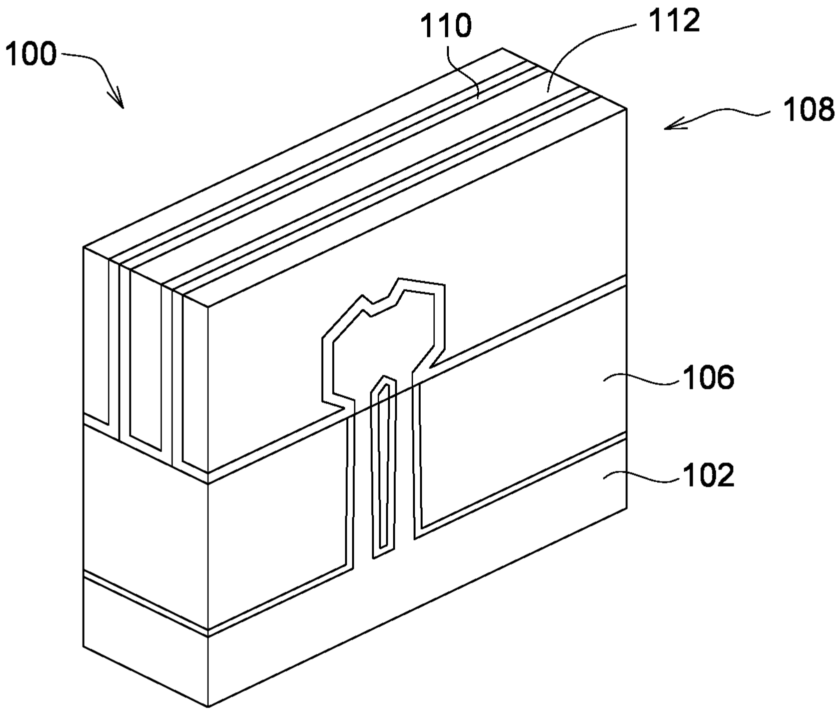
FIGS. 5A to 5F are schematic diagrams illustrating a manufacturing method of a semiconductor device according to an embodiment of the present disclosure.

Referring to FIG. 5A to FIG. 5F, FIG. 5A to 5F are schematic diagrams illustrating a manufacturing method of a semiconductor device according to an embodiment of the present disclosure. The semiconductor device is, for example, a FinFET device 100, which includes a substrate 102, a plurality of fins 104 extending upward from the substrate 102, and a gate structure 108 covering the plurality of fins 104. The gate dielectric layer 110 can be formed by chemical oxidation, thermal oxidation, atomic layer deposition (ALD), physical vapor deposition (PVD), chemical vapor deposition (CVD) and/or other suitable methods. The gate electrode layer 112 is formed above the gate dielectric layer 110. In FIG. 5A, a planarization process is performed on the gate structure 108. The planarization process, for example, uses a chemical mechanical polishing tool to polish or planarize the surface of the deposited or plated gate material. Planarization tools can use abrasive and aggressive chemical slurries in combination with polishing pads and retaining rings. The polishing pad typically has a larger diameter than the diameter of the wafer substrate. The polishing pad and wafer substrate may be pressed together by a dynamic polishing head and held in place by a retaining ring. The dynamic grinding head can be rotated on different rotation axes to remove material and even out any topography of the gate structure 108, making the gate structure 108 planar.

Figure 5B:
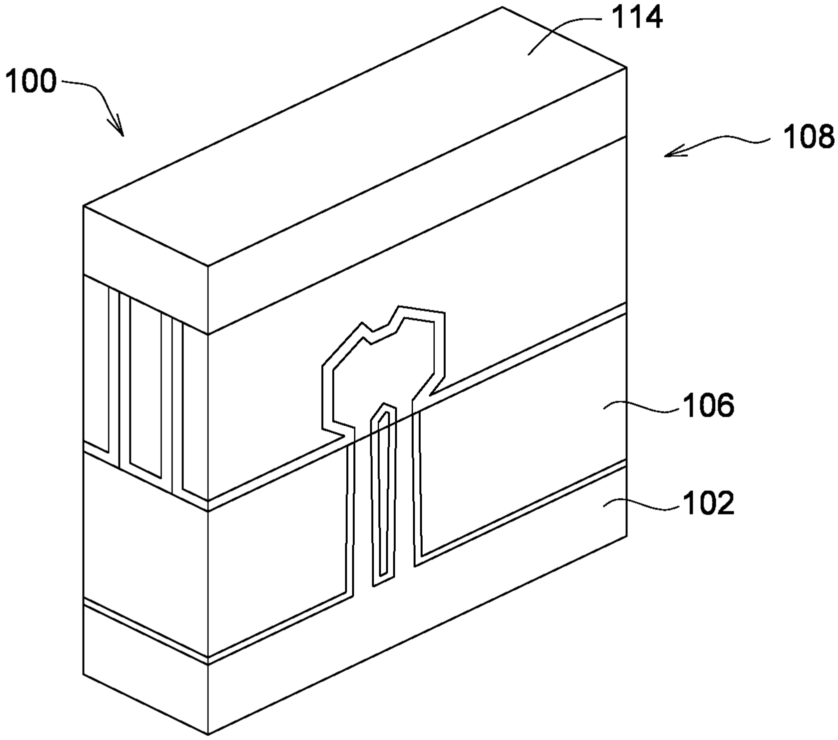
Figure 5C:
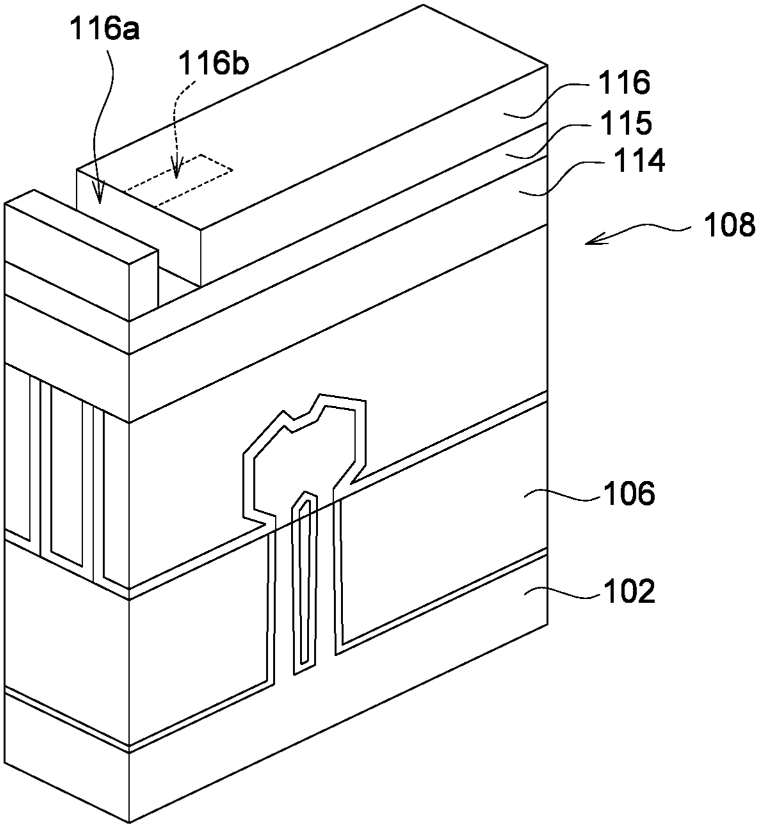
Figure 5D:
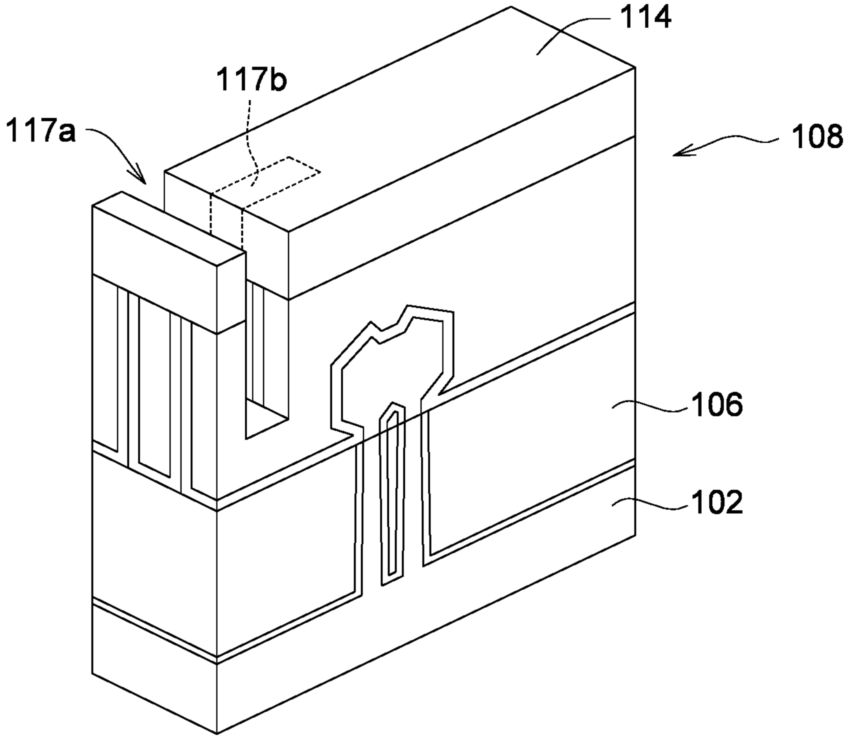

In FIG. 5B, a hard mask layer 114 is formed on the gate structure 108. The hard mask layer 114 includes silicon nitride, silicon oxynitride, silicon carbonitride or a combination thereof, which can be a single-layer structure or a multi-layer structure. In FIG. 5C, a photoresist layer 116 is formed on the hard mask layer 114 and the gate structure 108. By developing and removing a part of the photoresist layer 116, the photoresist layer 116 is patterned to expose an opening 116*a* above the first fin 104*a* to be removed (see FIG. 6A). Before forming the photoresist layer 116, a bottom anti-reflection coating (BARC) 115 is formed on the hard mask layer 114 to reduce light reflection in the photoresist layer 116 during exposure. In FIG. 5D, the first fin 104*a* and the gate structure 108 and the hard mask layer 114 covering the first fin 104*a* can be removed by an etching process to form a recessed region 117*a* in the channel region 103. Etching processes include plasma etching processes, wet chemical etching processes, and/or other types of etching processes. After the first fins 104*a* are etched, the number of remaining fins 104 in the channel region 103 is reduced, as shown in FIG. 6A.

Figure 6A:
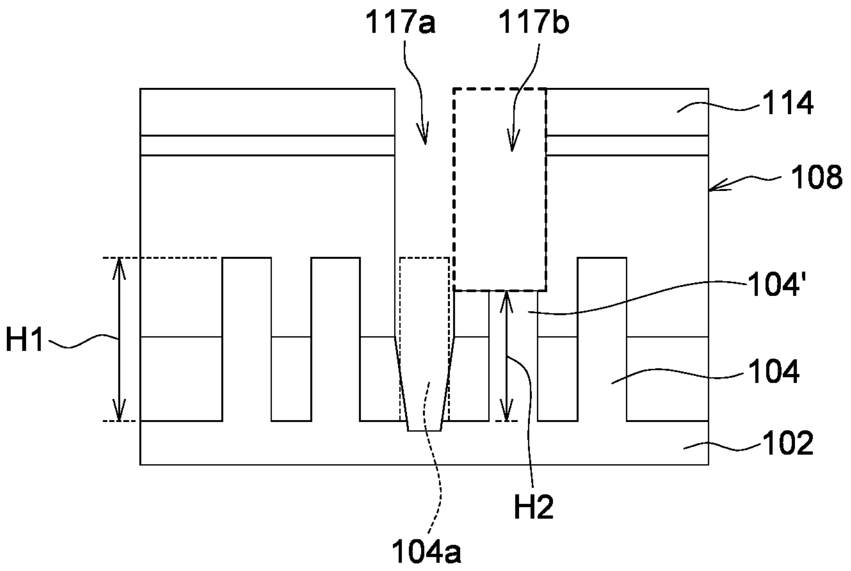
FIGS. 6A and 6B are schematic diagrams of a FinFET device after a portion of the fins in the gate structure are etched.

In some embodiments, referring to FIG. 5C, another part of the photoresist layer 116 can also be developed and removed, so that the photoresist layer 116 is patterned to expose another opening 116*b* corresponding to the portion to be partially removed above a second fin 104' (refer to FIG. 6A). In FIG. 5D, a part of the second fin 104' and the gate structure 108 and hard mask layer 114 covering the second fin 104' can be removed through an etching process to form another recessed region 117*b* in the channel region 103. After the second fin 104' is partially etched, the height H2 of the second fin 104' is reduced to become a short fin, as shown in FIG. 6A. The height H2 of the second fin 104' is less than the height H1 of the remaining fins 104 that have not been etched, for example, the height H2 is reduced by ¼H1 to ½H1, but the second fin 104' can be completely or partially removed, which is not limited in the present disclosure. That is to say, the semiconductor device includes at least one short fin 104', and the height H2 of the at least one short fin 104' located in the channel region 103 is shorter than the height H1 of the long fin 104 in the source region 105 and the drain region 107.

Figure 5E:
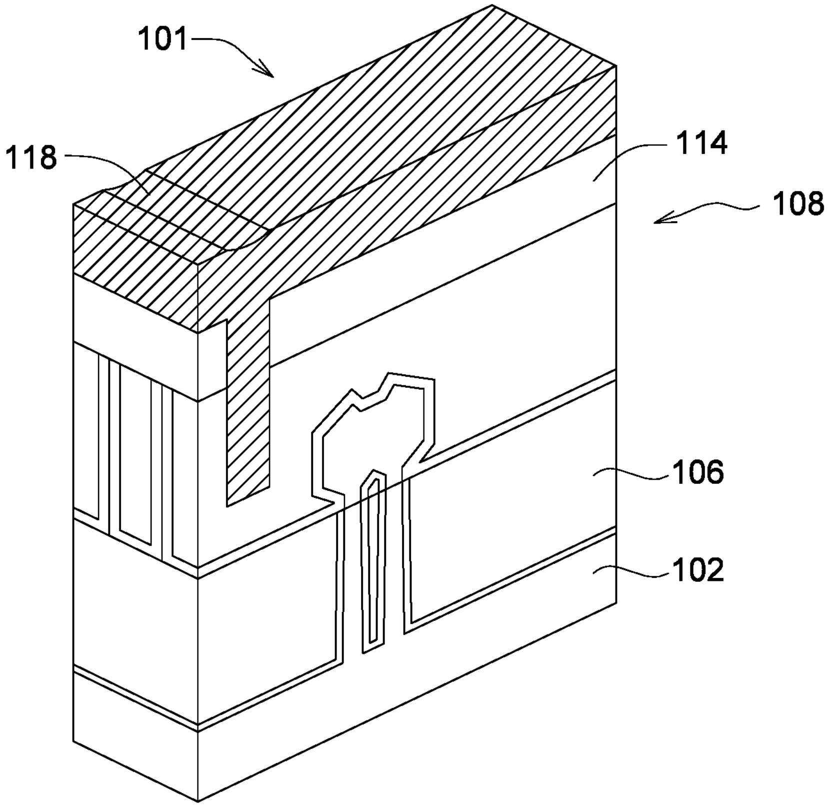
Figure 5F:
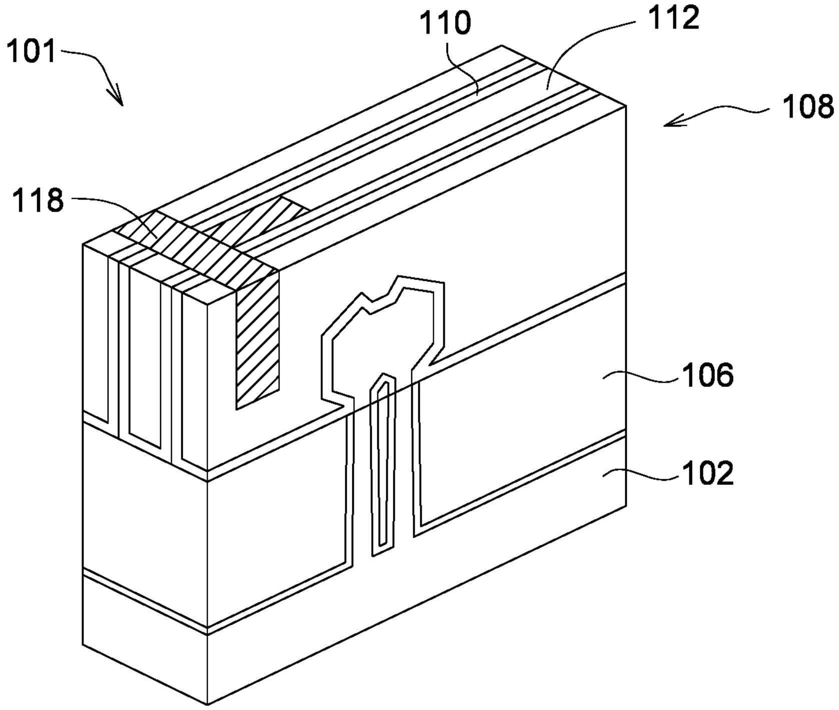
Figure 6B:
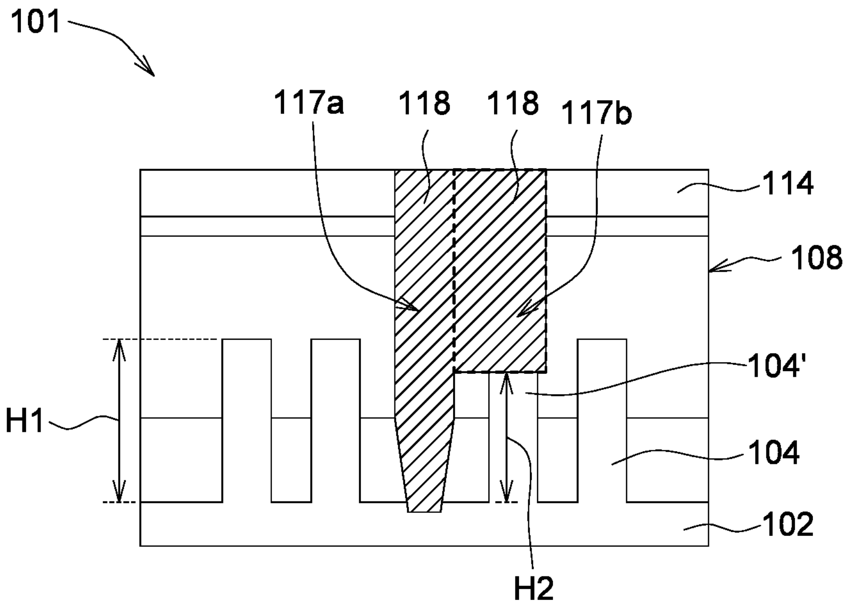

In FIG. 5E, an insulating material 118 is filled into the removed fin region (i.e., the recessed regions 117*a* and 117*b*). The insulating material 118 includes silicon nitride, silicon oxynitride, silicon carbonitride or its combination. The insulating material 118 may be deposited by CVD, PVD, ALD, or other deposition techniques. The insulating material 118 can be filled into the gate structure 108 and between the unetched fins 104 or cover the partially etched second fins 104'. In FIG. 5F, after forming the insulating material 118 in the recessed regions 117*a* and 117*b*, the photoresist layer 116 is removed and a planarization process is performed. The planarization process, for example, uses a chemical mechanical polishing tool to polish or planarize the deposited insulating material 118, so that the upper surface of the insulating material 118 is coplanar with the upper surfaces of the gate structure 108 or the hard mask layer 114, as shown in FIG. 6B.

In FIG. 5F, the process after the planarization process further includes depositing a contact etch stop layer (CESL) 121 over the gate structure 108. The CESL 121 may provide a protection for stopping the etch process before forming contacts or vias correspondingly connecting to the gate structure 108 of the FinFET device 101. The CESL 121 may be formed of a dielectric material having a different etch selectivity than adjacent layers. The CESL 121 may include or be a nitrogen-containing material, a silicon-containing material, and/or a carbon-containing material. In addition, the CESL 121 may include or may be silicon nitride, silicon carbonitride, carbon nitride, silicon oxynitride, silicon carbon oxide, or a combination thereof. The CESL 121 may be deposited by a deposition process such as ALD, CVD or other deposition techniques. Additionally, a metal silicide layer (not shown) may be formed on the top surfaces of the source/drain regions 105 and 107 prior to forming source/drain contacts over the source region 105 and/or drain region 107, to reduce the contact resistance between the source/drain regions 105 and 107 and the source/drain contacts. A pre-clean process may be used to prepare the top surfaces of the source/drain regions 105, 107 for metal silicide to remove remaining oxide and other contaminants. After the pre-cleaning process, a metal layer is formed over the source/drain regions 105 and 107, and a high temperature anneal is performed to react the metal with silicon to form a metal silicide layer.

Figure 7:
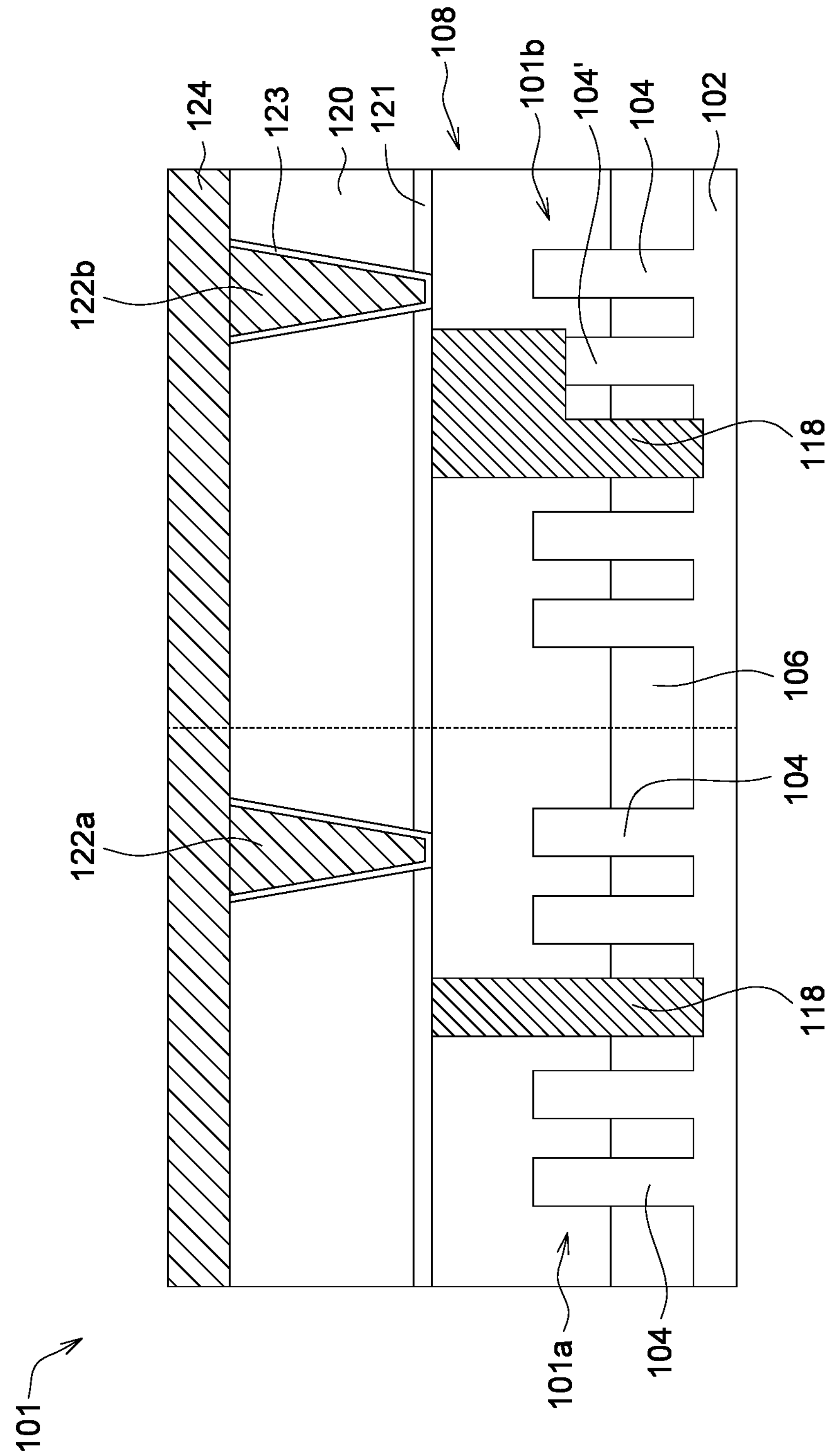
FIG. 7 is a schematic diagram of a semiconductor device according to an embodiment of the disclosure.

Referring to FIG. 7, which is a schematic diagram of a semiconductor device according to an embodiment of the present disclosure. After the contact etch stop layer 121 is deposited, an interlayer dielectric layer (ILD) 120 is formed on the contact etch stop layer 121. The interlayer dielectric layer 120 may be made of amorphous SiOx, SiOxCyHz, SiOxCy, SiCx or related low-k materials, and the k value may range from 2.0 to 3.0 or from 2.5 to 3.5. The interlayer dielectric layer 120 may be made of SiOx, SiOxCyHz, SiOxCy, SiCx or related low-k materials with ordered pores or non-porosity. As used herein, the term "ordered pores" refers to voids or air gaps formed in a dielectric material in a predetermined arrangement and filled with air. The interlayer dielectric layer 120 with ordered pores has the characteristics of low dielectric constant and high mechanical strength. In some embodiments, the interlayer dielectric layer 120 can be deposited at a temperature between 450 degrees Celsius (° C.) and 300 degrees Celsius (° C.) by chemical vapor deposition (CVD), physical vapor deposition (PVD), atomic layer deposition (ALD), spin coating or other suitable processes. In some embodiments, an additional annealing or ultraviolet (UV) curing process may be performed for the fabrication of the interlayer dielectric layer 120, but may not be used.

Next, the first conductive metal **122*a* and/or the second conductive metal 122*b* are formed in the interlayer dielectric layer 120. The first and second conductive metals 122*a* and 122*b* may include Cu, Ni, Co, Ru, Ir, Al, Pt, Pd, Au, Ag, Os, W, Mo or related alloys. The first and second conductive metals 122*a* and 122*b*** can be deposited at a temperature between 450° C. and 300° C. through atomic layer deposition (ALD), chemical vapor deposition (CVD), physical vapor deposition (PVD), electroless plating (ELD), electrochemical electroless plating (ECP) or other suitable processes.

In some embodiments, a barrier layer 123 may be formed between the interlayer dielectric layer 120 and the respective conductive metal. In some embodiments, the conductive metal can be formed in the interlayer dielectric layer 120 by dual damascene, single damascene, half damascene or other suitable processes. Taking the single damascene process as an example, a contact etch stop layer (CESL) 121 and an interlayer dielectric layer 120 are sequentially deposited, and the interlayer dielectric layer 120 is etched to form openings according to a predefined pattern. Then, a barrier layer 123 is deposited in the opening, and a conductive material (e.g., copper) is deposited on the barrier layer 123. The conductive material is deposited on the barrier layer 123 in the opening. A seed layer can be formed on the barrier layer 123 through a physical vapor deposition (PVD) process, and then a conductive material can be formed on the seed layer through an electrodeposition process. Afterwards, the upper surfaces of the conductive materials are planarized so that the upper surfaces of the first and second conductive metals **122*a* and 122*b*, the barrier layer 123 and the interlayer dielectric layer 120** are substantially coplanar.

In some embodiments, a metal layer 124 is formed on the first conductive metal **122*a*, the second conductive metal 122*b* and the interlayer dielectric layer 120. Before a conductive material is deposited on the interlayer dielectric layer 120, a seed layer can be formed on the interlayer dielectric layer 120 through a physical vapor deposition (PVD) process, and then the conductive material can be formed on the seed layer through an electrodeposition process. Afterwards, the upper surface of the conductive material is planarized to form the metal layer 124. The material of the metal layer 124** may include Cu, Ni, Co, Ru, Ir, Al or related alloys.

In some embodiments, two semiconductor devices having different numbers of fins may share the same metal layer 124. The metal layer 124 is electrically connected to the gate structure 108 through the first conductive metal **122*a* and the second conductive metal 122*b* respectively. As shown in FIG. 7, the number of unetched fins 104 in the first FinFET device 101*a* on the left side is n (e.g., 4), and the number of the unetched fins 104 and the partially-etched second fin 104' in the second FinFET device 101*b* on the right side is m (e.g., 3.5 or less than 4), where n is not equal to m. The numbers n and m are not limited to integers, and can be non-integer greater than 1, such as 1.8, 2.4, 3.2 or 3.6, etc., wherein the non-integer part (such as 0.2, 0.4, 0.6 or 0.8) represents that a part of the partially-etched second fin 104'. When the number or height of fins is reduced, the number of the channel region 103 is also reduced. Therefore, the FinFET device 101 with reduced number of fins and/or reduced fin height can control the current passing through the channel region 103 to reduce power consumption. At the same time, the multi-gate FinFET device 101** of the present disclosure can increase the gate-channel coupling, reduce the off-state current and reduce the short-channel effects (SCEs) so as to improve gate control reliability.

The present disclosure relates to a semiconductor device and a manufacturing method thereof, which are used to reduce power consumption by reducing the number or height of fins in the gate structure to reduce the current passing through the channel region. Therefore, it is not necessary to use traditional photoetching and implant layers to fine-tune the semiconductor device, and thereby the cost and time of the manufacturing process for the semiconductor device can be reduced.

According to some embodiments of the present disclosure, a semiconductor device is provided. The semiconductor device includes a source region, a drain region, a channel region and a plurality of fins. The channel region is located between the source region and the drain region, and the fins pass through the source region, the drain region and the channel region, wherein a number of the fins located in the source region and the drain region and a number of the fins located in the channel region are not equal.

According to some embodiments of the present disclosure, a semiconductor device is provided. The semiconductor device includes a source region, a drain region, a channel region and a plurality of fins. The channel region is located between the source region and the drain region, and the fins pass through the source region, the drain region and the channel region, wherein heights of the fins located in the channel region are not equal.

According to some embodiments of the present disclosure, a manufacturing method of a semiconductor device is provided. The semiconductor device includes a substrate, a plurality of fins extending upward from the substrate, and a gate structure covering the fins. The manufacturing method of the semiconductor device includes the following steps. a photoresist layer is formed on the gate structure, a part of the photoresist layer is developed and removed, so that the photoresist layer is patterned to form an opening corresponding to a top location of a first fin to be removed among the fins. The first fin and the gate structure covering the first fin are etched to form a recessed region in the gate structure. An insulating material is filled into the recessed region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor device, the semiconductor device comprising an active device having a substrate, a plurality of fins extending upward from the substrate, a source region, a drain region and a gate structure covering the fins between the source region and the drain region to form multi-channels between the source region and the drain region, the method manufacturing of the semiconductor device comprising:

forming a photoresist layer on the gate structure, developing and removing a part of the photoresist layer, so that the photoresist layer is patterned to form an opening corresponding to a top location of a first fin to be removed among the fins;

etching the first fin and the gate structure covering the first fin to form a recessed region in the gate structure so as to cut one of the multi-channels in the active device; and filling an insulating material into the recessed region.

2. The manufacturing method according to claim 1, wherein the fins pass through the source region and the drain region, and a number of remaining unetched fins of the fins in the gate structure is less than a number of the fins in the source region and the drain region.

3. The manufacturing method according to claim 1, further comprising:

developing and removing another part of the photoresist layer, so that the photoresist layer is patterned to form another opening corresponding to a top location of a second fin to be partially etched among the fins;

etching a portion of the second fin and the gate structure covering the second fin to form another recessed region in the gate structure; and filling the insulating material into the another recessed area-region.

4. The manufacturing method according to claim 3, wherein a height of the second fin is less than a height of the remaining unetched fins.

5. The manufacturing method according to claim 1, further comprising:

forming an interlayer dielectric layer on the gate structure;

forming a first conductive metal and a second conductive metal in the interlayer dielectric layer; and forming a metal layer on the first conductive metal, the second conductive metal and the interlayer dielectric layer, wherein the metal layer is electrically connected to the gate structure through the first conductive metal and the second conductive metal respectively.

6. The manufacturing method according to claim 5, wherein the active device comprises a first active device and a second active device, each of the first and second devices have respective multi-channels within the fins and located between the source region and the drain region, wherein the gate structure of the first active device and the gate structure of the second active device share the metal layer, and a number of remaining unetched fins of the fins in the first active device and a number of remaining unetched fins of the fins in the second active device are not equal.

7. A manufacturing method of a semiconductor device, comprising:

forming a source region, a drain region and a plurality of fins on a substrate, the fins extending upward from the substrate and passing through the source region and the drain region of an active device;

forming multi-channels within the fins and located between the source region and the drain region; and etching at least one of the fins to form a reduced number of the fins in the multi-channels of the active device.

8. The manufacturing method according to claim 7, further comprising forming a gate structure located on the fins and the channel region, and the source region and the drain region are located on opposite sides of the gate structure.

9. The manufacturing method according to claim 8, wherein a number of remaining unetched fins in the gate structure is less than a number of the fins located in the source region and the drain region.

10. The manufacturing method according to claim 9, further comprising etching another one of the fins to form a partially etched fin among the remaining unetched fins.

11. The manufacturing method according to claim 10, wherein a height of the partially etched fin is less than a height of the remaining unetched fins.

12. The manufacturing method according to claim 8, further comprising:

forming an interlayer dielectric layer on the gate structure;

forming a first conductive metal and a second conductive metal in the interlayer dielectric layer; and forming a metal layer on the first conductive metal, the second conductive metal and the interlayer dielectric layer, wherein the metal layer is electrically connected to the gate structure through the first conductive metal and the second conductive metal respectively.

13. The manufacturing method according to claim 12, wherein the active device comprises a first active device and a second active device, each of the first and second devices have respective multi-channels within the fins and located between the source region and the drain region, wherein the gate structure of the first active device and the gate structure of the second active device share the metal layer, and a number of remaining unetched fins of the fins in the first semiconductor device and a number of remaining unetched fins of the fins in the second semiconductor device are not equal.

14. A manufacturing method of a semiconductor device, comprising:

forming a plurality of fins on a substrate, the fins extending upward from the substrate and passing through a source region and a drain region of the substrate;

forming multi-channels within the fins and located between the source region and the drain region of an active device;

forming a gate structure covering the fins and the multi-channels; and forming a recessed region in the gate structure corresponding to a top location of a first fin to be removed among the fins and etching the first fin to form a reduced number of the fins in the multi-channels of the active device.

15. The manufacturing method according to claim 14, wherein a number of remaining unetched fins in the gate structure is less than a number of the fins located in the source region and the drain region.

16. The manufacturing method according to claim 15, further comprising form another recessed region in the gate structure and etching a second fin of the fins to form a partially etched fin among the remaining unetched fins.

17. The manufacturing method according to claim 16, wherein a height of the partially etched fin is less than a height of the remaining unetched fins.

18. The manufacturing method according to claim 14, further comprising:

forming an interlayer dielectric layer on the gate structure;

forming a first conductive metal and a second conductive metal in the interlayer dielectric layer; and forming a metal layer on the first conductive metal, the second conductive metal and the interlayer dielectric layer, wherein the metal layer is electrically connected to the gate structure through the first conductive metal and the second conductive metal respectively.

19. The manufacturing method according to claim 18, wherein the active device comprises a first active device and a second active device, each of the first and second devices have respective multi-channels within the fins and located between the source region and the drain region, wherein the gate structure of the first active device and the gate structure of the second active device share the metal layer, and a number of remaining unetched fins of the fins in the first active device and a number of remaining unetched fins of the fins in the second active device are not equal.

20. The manufacturing method according to claim 14, further comprising filling an insulating material into the recessed region.

* * * * *